(12) United States Patent
Sasaki

(10) Patent No.: US 10,276,466 B2
(45) Date of Patent: Apr. 30, 2019

(54) SEMICONDUCTOR DEVICE AND SEMICONDUCTOR DEVICE MOUNTING METHOD

(71) Applicant: SHINDENGEN ELECTRIC MANUFACTURING CO., LTD., Tokyo (JP)

(72) Inventor: Mitsumasa Sasaki, Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 15/576,277

(22) PCT Filed: May 29, 2015

(86) PCT No.: PCT/JP2015/065569
§ 371 (c)(1),
(2) Date: Nov. 21, 2017

(87) PCT Pub. No.: WO2016/194045
PCT Pub. Date: Dec. 8, 2016

(65) Prior Publication Data
US 2018/0145005 A1 May 24, 2018

(51) Int. Cl.
*H01K 11/00* (2006.01)
*H01L 23/28* (2006.01)
(Continued)

(52) U.S. Cl.
CPC ............. *H01L 23/28* (2013.01); *H01L 21/56* (2013.01); *H01L 23/13* (2013.01); *H01L 23/4006* (2013.01); *H01L 23/49562* (2013.01); *H01L 23/49575* (2013.01); *H01L 25/07* (2013.01); *H01L 25/18* (2013.01); *H02K 11/00* (2013.01); *H02K 11/33* (2016.01); *H05K 7/1432* (2013.01);
(Continued)

(58) Field of Classification Search
None
See application file for complete search history.

(56) References Cited

U.S. PATENT DOCUMENTS

| | | |
|---|---|---|
| 2007/0267927 A1 | 11/2007 | Chen |
| 2013/0334906 A1 | 12/2013 | Sonoda et al. |
| 2014/0326530 A1 | 11/2014 | Asao et al. |

FOREIGN PATENT DOCUMENTS

| | | |
|---|---|---|
| JP | 2002-184940 A | 6/2002 |
| JP | 2012-182957 A | 9/2012 |

(Continued)

OTHER PUBLICATIONS

International Search Report (ISR) relating to International Application No. PCT/JP2015/065569, dated Jul. 21, 2015.
(Continued)

*Primary Examiner* — Reema Patel
(74) *Attorney, Agent, or Firm* — The Harris Firm

(57) ABSTRACT

A semiconductor device of the present invention includes: a substrate (12) that is annular or partially annular, the substrate (12) having an inner circumferential portion (20) formed arcuate in plan view and an outer circumferential portion (21) formed arcuate in plan view; a circuit unit (13) provided on the substrate (12), the circuit unit (13) being configured to individually control a plurality of phases of a motor; and a sealing resin (18) that is circular annular or partially circular annular and is concentric to the substrate (12), the sealing resin (18) surrounding the substrate (12).

5 Claims, 8 Drawing Sheets

(51) Int. Cl.
- *H01L 25/07* (2006.01)
- *H01L 25/18* (2006.01)
- *H02K 11/00* (2016.01)
- *H01L 21/56* (2006.01)
- *H01L 23/495* (2006.01)
- *H05K 7/14* (2006.01)
- *H02K 11/33* (2016.01)
- *H01L 23/13* (2006.01)
- *H01L 23/40* (2006.01)
- *H02M 7/00* (2006.01)
- *H01L 23/373* (2006.01)

(52) U.S. Cl.
CPC .... *H01L 23/3735* (2013.01); *H01L 23/49541* (2013.01); *H02K 2211/03* (2013.01); *H02M 7/003* (2013.01)

(56) References Cited

FOREIGN PATENT DOCUMENTS

| | | |
|---|---|---|
| JP | 2013-247790 A | 12/2013 |
| JP | 2015-061409 A | 3/2015 |

OTHER PUBLICATIONS

European Patent Office, Extended European Search Report relating to EP 15894080, dated Nov. 9, 2018.

SEMICONDUCTOR DEVICE AND SEMICONDUCTOR DEVICE MOUNTING METHOD

CROSS REFERENCE TO PRIOR APPLICATION(S)

This application is a U.S. National Stage Patent Application of PCT International Patent Application Ser. No. PCT/JP2015/065569 (filed on May 29, 2015) under 35 U.S.C. § 371, which is hereby incorporated by reference herein in its entirety.

TECHNICAL FIELD

The present invention relates to a semiconductor device and a semiconductor device mounting method.

BACKGROUND ART

Conventionally, a semiconductor device that is rectangular in plan view and includes a module array is known as described in, for example, Patent Document 1. Patent Document 1 discloses that module arrays including a plurality of modules are connected to one another with a metal connecting plate.

CITATION LIST

Patent Document

[Patent Document 1] Japanese Patent Application Laid-Open Publication No. 2002-184940

SUMMARY OF THE INVENTION

Problems to be Solved by the Invention

When attempting to attach the conventional semiconductor device that is rectangular in plan view onto an attaching surface that is annular or partially-annular in plan view, there arises some cases where a part of the attaching surface becomes a useless area where a semiconductor device cannot be arranged, or the semiconductor device protrudes from the attaching surface.

The present invention has been made in view of the above circumstances, and has an object to provide a semiconductor device and a semiconductor device mounting method capable of effectively utilizing an attaching surface to be attached with a semiconductor device and capable of suppressing wiring burden.

Means for Solving the Problems

A semiconductor device according to one aspect of the present invention includes: a substrate that is annular or partially annular, the substrate having an inner circumferential portion formed arcuate in plan view and an outer circumferential portion formed arcuate in plan view; a circuit unit provided on the substrate, the circuit unit being configured to individually control a plurality of phases of a motor; and a sealing resin that is annular or partially annular, the sealing resin surrounding the substrate.

Effects of the Invention

According to the present invention, it is possible to effectively utilize an attaching surface to be attached with a semiconductor device and to suppress wiring burden.

MODE FOR CARRYING OUT THE INVENTION

First Embodiment

A first embodiment of the present invention will be described with reference to FIGS. 1 to 8.

Figure 1:
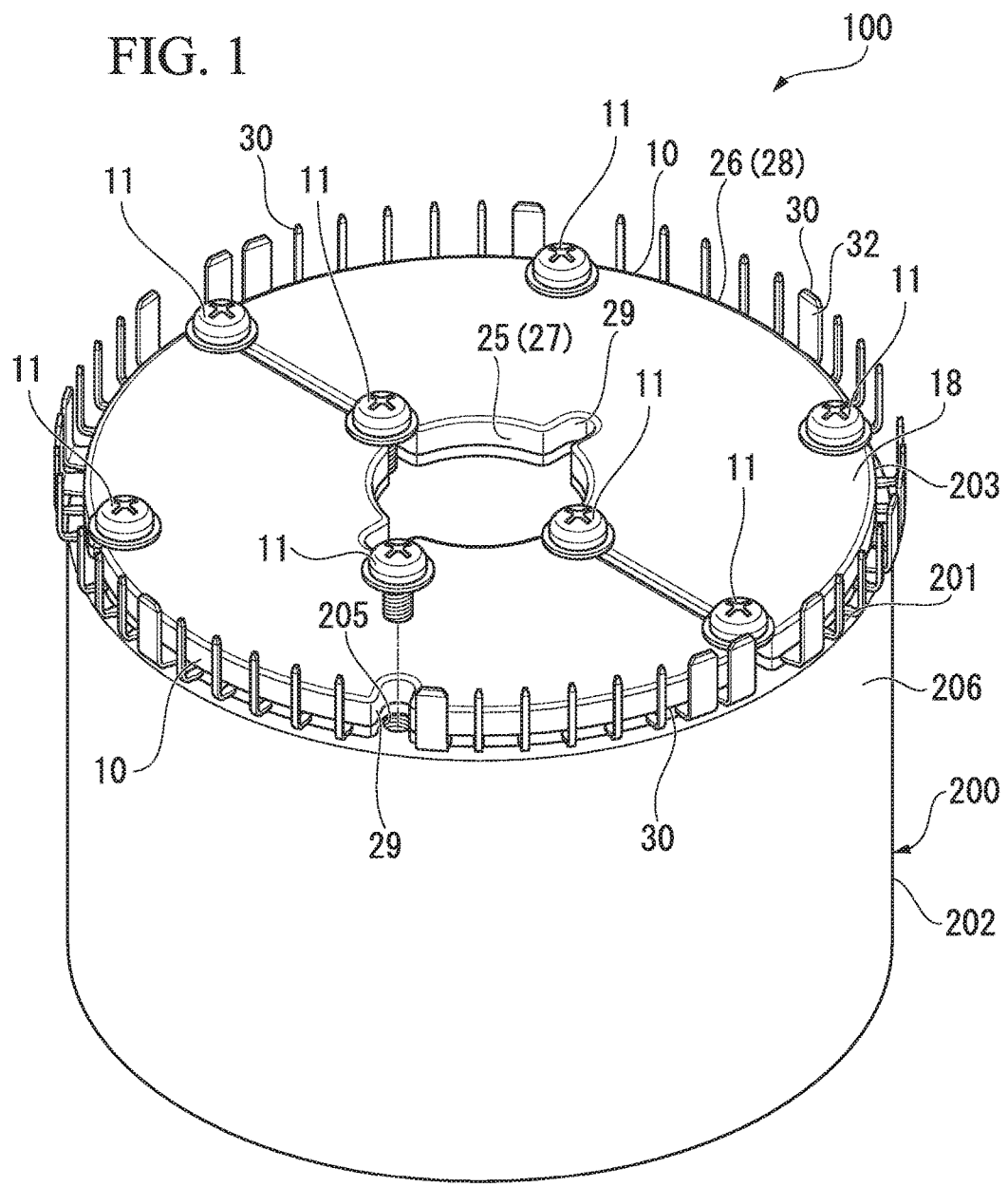
FIG. 1 is an external perspective view of a state where a semiconductor device according to a first embodiment of the present invention has been attached on a motor.

As shown in FIG. 1, a semiconductor device 100 of the present embodiment is a control device for controlling an apparatus to be controlled. An object to be controlled by the semiconductor device 100 of the present embodiment is not particularly limited. As an example, the semiconductor device 100 of the present embodiment controls operation of a three-phase motor (hereinafter, simply referred to as "motor.") 200.

The semiconductor device 100 of the present embodiment is attachable on a predetermined attaching surface 201 provided on the motor 200 to be controlled. A shape of the attaching surface 201 is occasionally restricted depending on, for example, a structure of the motor 200. For example, the attaching surface 201 is provided on an outer surface of a case 202 for housing a coil and the like of the motor 200, which is one end face 203 of both end faces, in an extending direction (vertical direction in FIG. 1), of a rotation axis (not shown) of the motor 200. The attaching surface 201 is a plane orthogonal to the rotation axis of the motor 200.

Additionally, the case 202 of the motor 200 illustrated in the present embodiment is in substantially a cylindrical shape. Further, in some cases, the case 202 of the motor 200 is provided with a protruding portion 204 (see FIG. 3) which protrudes outward from the case 202 to hold the rotation axis of the motor 200, on one or both ends, in the extending direction, of the rotation axis of the motor 100. The attaching surface 201 of the present embodiment has a circular annular shape surrounding an outer circumference of the protruding portion 204 formed on the case 202. In other words, the attaching surface 201 of the motor 200 to be fixed with the semiconductor device 100 of the present embodiment has a circular annular shape when viewed from the extending direction of the rotation axis of the motor 200. Here, in this specification, a view seen from the extending direction of the rotation shaft of the motor 200 is defined as a plan view. Additionally, the detailed shape of the attaching surface 201 is not limited to the shape described above.

Further, the attaching surface 201 provided on the motor 200 is provided with a plurality of screw holes 205 to be screwed with screws 11 for fixing, by screwing, the semiconductor device 100.

Next, a configuration of the semiconductor device 100 of the present embodiment will be described.

Figure 2:
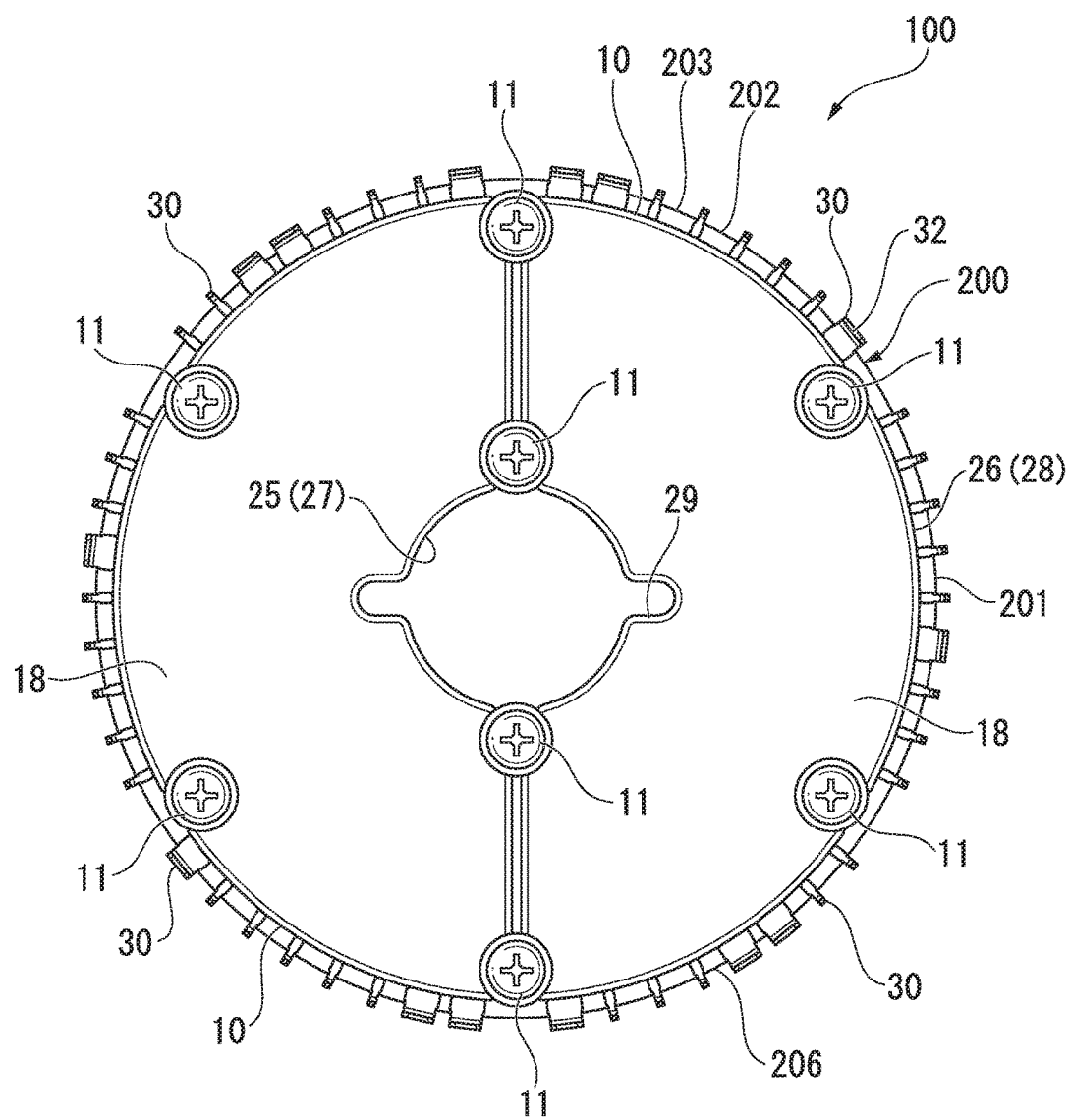
FIG. 2 is a plan view of the state where the semiconductor device has been attached on the motor.
Figure 3:
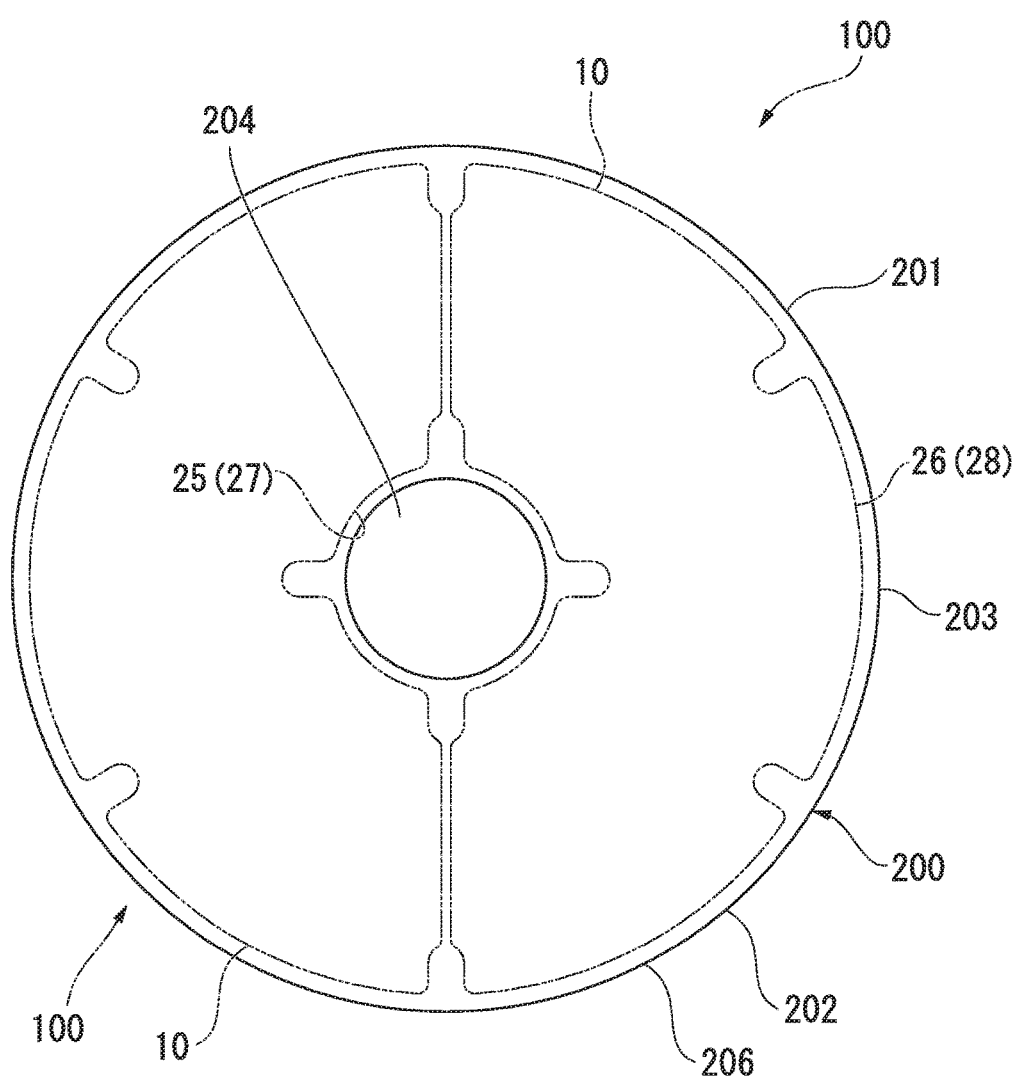
FIG. 3 is a schematic plan view showing an example of an attaching surface of the motor to be attached with the semiconductor device.

As shown in FIGS. 2 and 3, the semiconductor device 100 includes a device main body 10 and leads 30.

Figure 6:
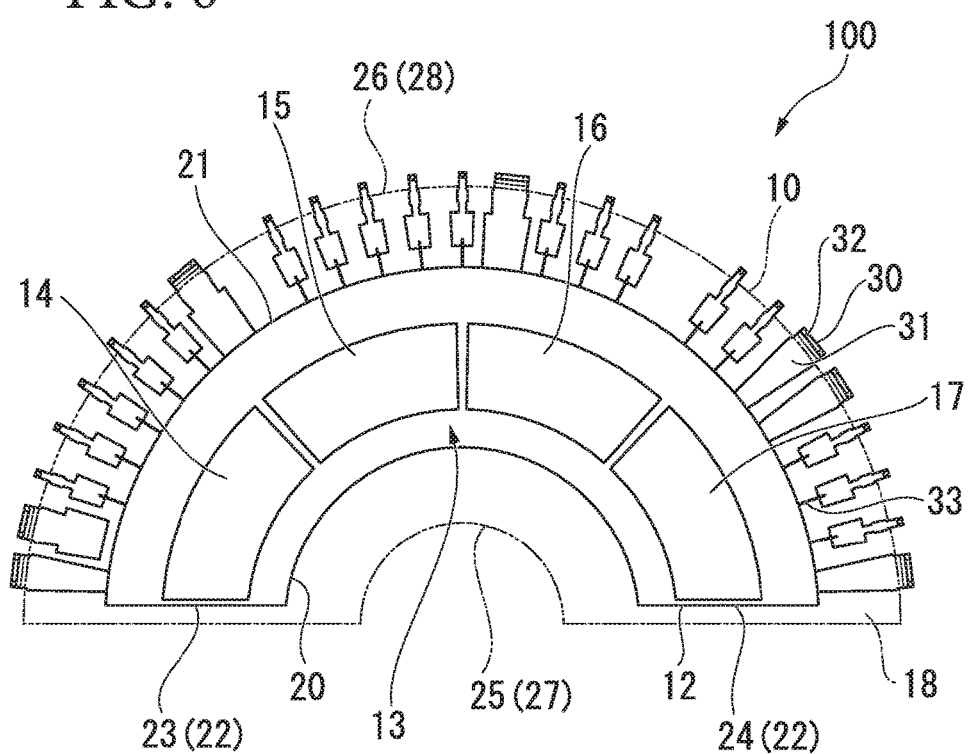
FIG. 6 is a schematic view showing a circuit arrangement of the semiconductor device.

As shown in FIGS. 2, 3, and 6, the device main body 10 includes a substrate 12, circuit unit 13, a relay circuit 17, and a sealing resin 18. Here, the device main body 10 need not include the relay circuit 17.

Figure 4:
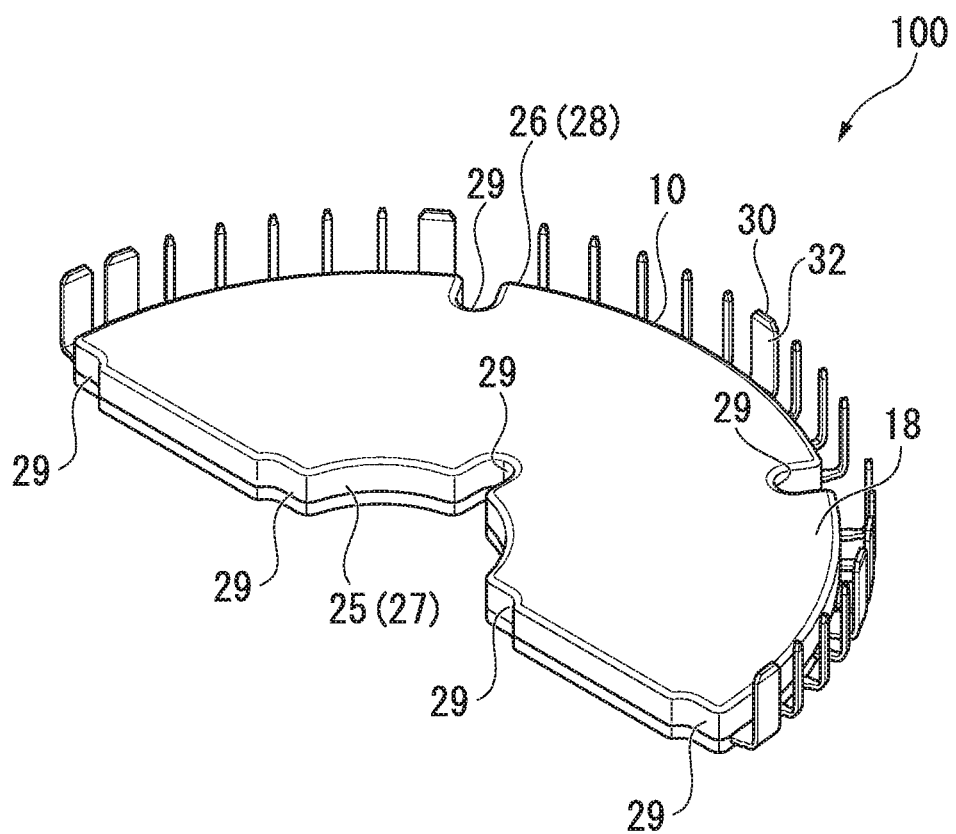
FIG. 4 is an external perspective view of the semiconductor device, as seen obliquely from above.
Figure 5:
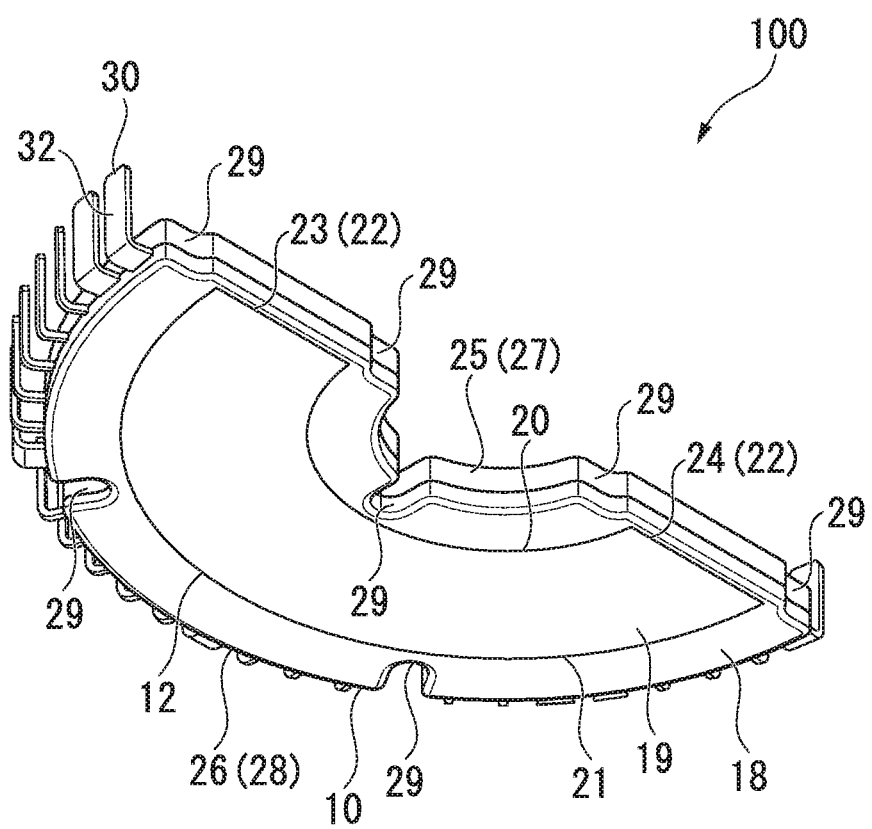
FIG. 5 is an external perspective view of the semiconductor device, as seen obliquely from below.

As shown in FIGS. 4 to 6, the substrate 12 is an insulating substrate (e.g., DCB substrate) with a heat dissipating function, which is formed by joining a ceramic plate and a circuit board 19 made of metal with high heat conductivity, such as copper or aluminum.

The substrate 12 has: an inner circumferential portion 20 and an outer circumferential portion 21 which are formed concentric and circular arcuate to each other in plan view; and end portions 22 in a circumferential direction of the substrate 12 (first end portion 23, second end portion 24). The substrate 12 is formed semicircular annular (partially annular, semi-annular) in plan view.

The inner circumferential portion 20 of the substrate 12 is formed in a circular arcuate shape so as to surround the protruding portion 204 formed on the motor 200, in the attached state where the semiconductor device 100 has been attached on the attaching surface 201 of the motor 200. A diameter dimension of the inner circumferential portion 20 of the substrate 12 is greater than, for example, an outer diameter dimension of the projecting portion 204.

The outer circumferential portion 21 of the substrate 12 is formed smaller in outer diameter dimension than an outer circumferential surface 206 of the case 202 of the motor 200 (see FIG. 1), in the attached state where the semiconductor device 100 has been attached on the attaching surface 201 of the motor 200.

A circuit board 19 provided on the substrate 12 is exposed to the outside of the sealing resin 18 in a state where the substrate 12 is sealed with the sealing resin 18 which will be described later.

The circuit board 19 contacts the attaching surface 201 of the motor 200 in the state where the semiconductor device 100 has been attached on the attaching surface 201 of the motor 200. By the circuit board 19 contacting the attaching surface 201 of the motor 200, for example, it is possible to release heat generated in the semiconductor device 100 to the case 202 of the motor 200.

The circuit unit 13 includes a first phase control circuit 14, a second phase control circuit 15, and a third phase control circuit 16. The circuit unit 13 individually controls the plurality of phases of the motor 200.

The first phase control circuit 14, the second phase control circuit 15, and the third phase control circuit 16 are arranged in the circumferential direction of the substrate 12 in this order.

The first phase control circuit 14 controls a U-phase (first phase) of the motor 200. The first phase control circuit 14 includes a switching unit (e.g., FET), a resistor, or the like.

The second phase control circuit 15 controls a V-phase (second phase) of the motor 200. The second phase control circuit 15 includes a switching unit (e.g., FET), a resistor, or the like.

The third phase control circuit 16 controls a W-phase (third phase) of the motor 200. The third phase control circuit 16 includes a switching unit (e.g., FET), a resistor, or the like.

The relay circuit 17 is arranged adjacent to the third phase control circuit 16 in the circumferential direction of the substrate 12. The relay circuit 17 includes a switching unit (e.g., FET), a resistor, or the like.

The sealing resin 18 seals the substrate 12, the circuit unit 13, and the relay circuit 17. The sealing resin 18 has a shape substantially similar to the substrate 12. The sealing resin 18 of the present embodiment is formed in, for example, a semicircular annular shape that is larger than the substrate 12.

The outer surface of the sealing resin 18 defines the outer contour of the device main body 10. In other words, the sealing resin 18 has an inner circumferential surface 25 and an outer circumferential surface 26 which are formed mutually concentric and circular arcuate in plan view. The inner circumferential surface 25 of the sealing resin 18 is an inner circumferential surface 27 of the device main body 10. The outer circumferential surface 26 of the sealing resin 18 is an outer circumferential surface 28 of the device main body 10.

The inner circumferential surface 25 of the sealing resin 18 (inner circumferential surface 27 of the device main body 10) surrounds the protruding portion 204 provided on the attaching surface 201 of the motor 200, in the state where the semiconductor device 100 has been attached on the attaching surface 201 of the motor 200. As an example, the diameter dimension of the inner circumferential surface 25 of the sealing resin 18 (inner circumferential surface 27 of the device main body 10) is larger than the outer diameter dimension of the projecting portion 204.

Further, the sealing resin 18 has a cutout portion 29 to be locked with the screw 11 for screwing the device main body 10 of the semiconductor device 100 against the attaching surface 201. The cutout portion 29 is formed on the inner circumferential surface 27 of the device main body 10 that is the inner circumferential surface 25 of the sealing resin 18, and the outer circumferential surface 28 of the device main body 10 that is the outer circumferential surface 26 of the sealing resin 18. Therefore, as the screw 11 is locked into the cutout portion 29, the device main body 10 can stably be supported with respect to the attaching surface 201 (see FIGS. 1 and 2).

The leads 30 are made of a conductive metal member. In the present embodiment, the plurality of leads 30 are connected to the device main body 10. The plurality of leads 30 are arranged at intervals in the circumferential direction of the device main body 10. Each lead 30 has an inner lead portion 31 held by the sealing resin 18, and an outer lead portion 32 protruding from the sealing resin 18.

The inner lead portion 31 extends in the radial direction of the sealing resin 18, and is disposed on the outer circumferential portion 21 side of the substrate 12. The inner lead portion 31 is electrically connected to the circuit unit 13 and the relay circuit 17 on the substrate 12 by a wire bonding 33 (details thereof not shown) or the like.

The outer lead portion 32 is bent in the middle of its projecting direction and thereby has a portion radially extending outward continuously from the inner lead portion 31, and a portion extending in the thickness direction of the substrate 12. The portion of the outer lead portion 32 extending in the thickness direction of the substrate 12 extends away from the circuit board 19 side.

Operation of the semiconductor device 100 of the present embodiment will be described.

Since the semiconductor device 100 of the present embodiment has the substrate 12 that is semicircular annular in plan view, the semiconductor device 100 is attachable onto the attaching surface 201 that is circular annular or semicircular annular in plan view, in accordance with the shape, in plan view, of the attaching surface 201. For example, in the present embodiment, the semiconductor device 100 of the present embodiment fits within the half portion of the circular annular attaching surface 201. Further, in the present embodiment, the two semiconductor devices 100, 100 are arranged such that the first end portion 23 of the substrate 12 of one semiconductor device 100 faces the second end portion 24 of the substrate 12 of the other semiconductor device 100. Thus, it is possible to attach the two semiconductor devices 100, 100 to fit within the circular annular attaching surface 201. In this state, the two semiconductor devices 100, 100 become circular annular as a whole.

Figure 7:
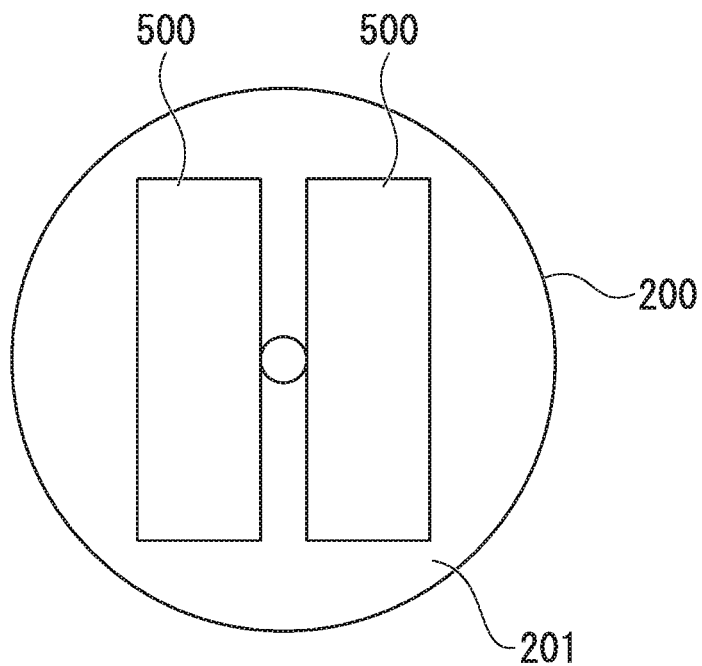
FIG. 7 is a schematic view showing an example of arrangement of a known semiconductor device.
Figure 8:
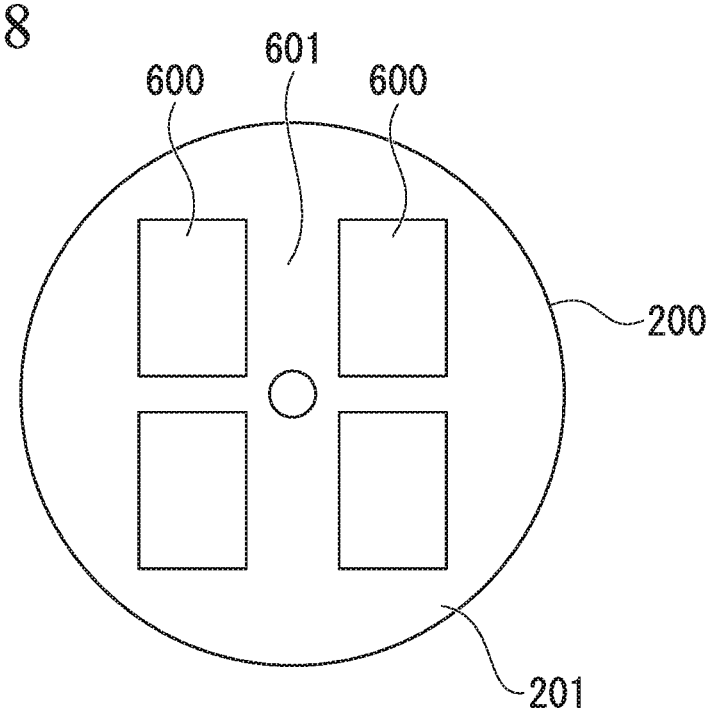
FIG. 8 is a schematic view showing another example of arrangement of a known semiconductor device.

As shown in FIGS. 7 and 8, in a case where the semiconductor device has a rectangular shape in plan view, the circular-annular attaching surface 201 come to include a useless area.

In other words, for example, when a semiconductor device 500 having a rectangular shape in plan view is attached so as to be fitted within the circular-annular attaching surface 201 as shown in FIG. 7, it is necessary to reduce the size of the semiconductor device 500 itself so that the semiconductor device 500 can be fitted within the attaching surface 201. In accordance with this, the upper limit of the size of each circuit of the semiconductor device 500 becomes small.

Additionally, as shown in FIG. 8, when attempting to arrange onto the annular attaching surface 201, sufficiently small rectangular semiconductor devices 600 so as to fit within the attaching surface 201, a part of the attaching surface 201 come to include unnecessary space 601 onto which the semiconductor devices 600 cannot be attached. Further, it is necessary to wire the semiconductor devices 600 individually, which is burdensome.

Compared with the cases shown in FIGS. 7 and 8, in the semiconductor device 100 of the present embodiment as shown in FIGS. 1 to 3, the attaching surface 201 that is circular annular so as to avoid the protruding portion 204 formed on the case 202 of the motor 200 is effectively utilized. In other words, in the semiconductor device 100 of the present embodiment that has a semicircular annular shape corresponding to the shape of the attaching surface 201 that is circular annular in plan view, the largest occupied area of the substrate 12 can be secured within the area of the half circle of the attaching surface 201. Therefore, the semiconductor device 100 of the present embodiment has a high degree of freedom of circuit arrangement on the substrate 12.

Additionally, in the semiconductor device 100 of the present embodiment that has a semicircular annular shape corresponding to the shape of the attaching surface 201 that is circular annular in plan view, the largest occupied area of the circuit board 19 can be secured within the area of the half circle of the attaching surface 201. Therefore, in the semiconductor device 100 of the present embodiment, the heat radiation efficiency from the semiconductor device 100 to the motor 200 is excellent.

As described above, according to the semiconductor device 100 of the present embodiment, it is possible to effectively arrange the semiconductor device 100 on the attaching surface 201 that is circular annular in plan view.

Further, according to the semiconductor device 100 of the present embodiment, since the first phase control circuit 14, the second phase control circuit 15, and the third phase control circuit 16 of the circuit unit 13 that individually controls the plurality of phases (U-phase, V-phase, W-phase) of the motor 200 are provided on the single substrate 12, it is possible to suppress wiring burden.

Moreover, since the plurality of leads 30 are connected only to the outer circumferential portion 21 of the substrate 12, in the state where the semiconductor device 100 has been attached on the attaching surface 201 such that the protruding portion 204 of the motor 200 is arranged inside the inner circumferential portion 20 of the substrate 12, the lead 30 does not interfere with the protruding portion 204, and the mounting is easy.

Additionally, in the present embodiment, the device main body 10 of the semiconductor device 100 is formed semicircular annular, while the two semiconductor devices 100 are circular annular so as to be attachable on the attaching surface 201 of the cylindrical motor 200. Therefore, in the state where the two semiconductor devices 100 have been attached on the motor 200, it is possible to make simple cylindrical the shape of the entire module including the both. Accordingly, by adopting this configuration, it is possible to easily assemble the module at a predetermined portion of an apparatus using the motor 200.

Further, the sealing resin 18 has the cutout portion 29, as the screw 11 is locked into the cutout portion 29, the device main body 10 can stably be supported with respect to the attaching surface 201

Second Embodiment

A second embodiment of the present invention will be described with reference to FIG. 9.

Figure 9:
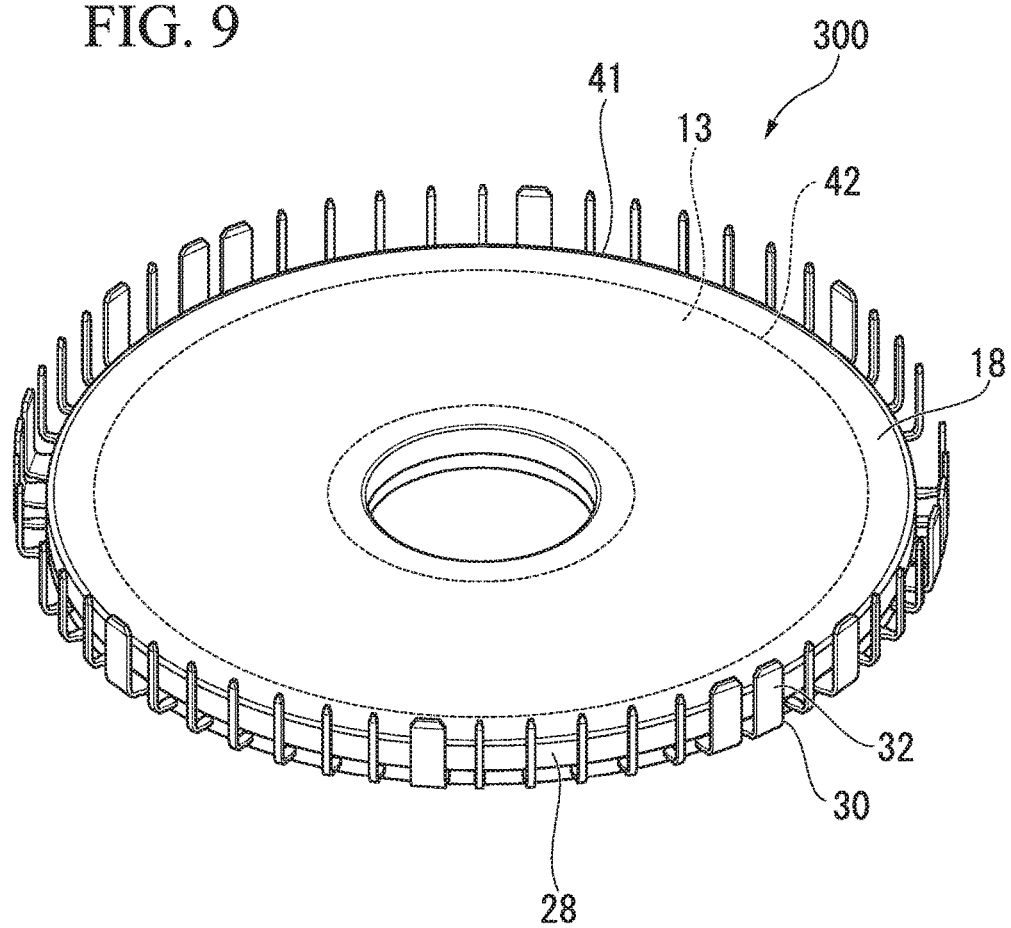
FIG. 9 is an external perspective view of a semiconductor device according to a second embodiment of the present invention.

As shown in FIG. 9, a semiconductor device 300 of the present embodiment is different from that of the first embodiment in that the semiconductor device 300 is continuously circular annular as a whole.

The semiconductor device 300 includes a device main body 41 that is circular annular in plan view, and a plurality of leads 30 extending outward from an outer circumferential surface 28 of the device main body 41.

Similarly to the first embodiment, the device main body 41 includes a substrate 42, the circuit unit 13 provided on the substrate 42 (see FIG. 6), the relay circuit 17, and the sealing resin 18 sealing the substrate 42.

However, the substrate 42 of the present embodiment is formed circular annular in plan view. Additionally, the circuit unit 13 provided on the substrate 42 may include, for example, two sets of the first phase control circuit 14, the second phase control circuit 15, and the third phase control circuit 16 are provided (see FIG. 9). Further, the circuit unit 13 may include, for example, another circuit in addition to the first phase control circuit 14, the second phase control circuit 15, and the third phase control circuit 16.

Similarly to the first embodiment, the leads 30 are connected to the circuit unit 13 and the relay circuit 17 on the substrate 42 by a wire bonding 33 or the like.

Similarly to the first embodiment, the semiconductor device 300 of the present embodiments are suitably attachable on the attaching surface 201 that is circular annular in plan view.

Although the embodiments of the present invention have been described in detail with reference to the drawings, specific configurations are not limited to those embodiments, design modifications made without departing from the spirit of the present invention are also included.

For example, although the examples that the shapes of the substrate and the device main body are semicircular annular or circular annular are shown in the above embodiments, the substrate and the device main body may be partially circular annular.

Additionally, the shape of the sealing resin may be circular annular or partially circular annular, not similar to the shape of the substrate.

Further, the attaching surface of the apparatus such as a motor to be attached with the semiconductor device is not limited to a circular annular shape, but may be a partially circular annular shape.

Moreover, in each of the above embodiments, although the outer circumferential surface and the inner circumferential surface of the device main body of the semiconductor device is formed circular arcuate, either one or both of the outer circumferential surface and the inner circumferential surface of the device main body may be a polygonal shape or an elliptical shape.

For example, the shape, in plan view, of the device main body may be any one of an elliptical annular shape, a polygonal annular shape, an annular shape with a radial width that is non-uniform in the circumferential direction. For example, in a case where an outer shape of the motor to be attached with the semiconductor device is a polygonal outer shape, the shape of the outer circumferential surface of the device main body may be an annular or partially annular shape having a polygonal outer circumferential surface corresponding to the outer shape of the motor. In this case, a shape, in plan view, of the inner circumferential surface of the device main body may be, for example, polygonal, circular, elliptic, or the like.

If the device main body has an outer shape other than a circular annular shape or semicircular annular shape, the description in the above embodiments and the above modified examples may be read by replacing the axial direction, the circumferential direction, and the radial direction with the directions relating to the entire outer shape or part of an approximate circle (circular arc), and its central axis.

The partially annular shape is not particularly limited as long as an inner circumferential surface of the device main body is formed in a groove shape. Therefore, even a center angle representing a range of the inner circumferential surface with respect to the center of the partially annular shape is not particularly limited. For example, the central angle is not limited to 180° as of the semicircular annular shape, may be smaller or larger than 180°.

For example, in a case where the semiconductor device is partially annular, the plurality of semiconductor devices are arranged so as to form an annular shape as a while, and thus are attached onto an annular attaching surface, thereby making it possible to secure the large occupied area of the attaching surface at the time of mounting the semiconductor devices Additionally, the inner circumferential surface and the outer circumferential surface of the device main body may be, for example, eccentric to each other. In a case where the device main body is partially annular, and the inner circumferential surface and the outer circumferential surface are eccentric to each other, by using two semiconductor devices having shapes that are mutually plane-symmetric in plan view, the two semiconductor devices can be attached on an apparatus so as to form an annular shape as a whole.

Further, regarding the substrate, similarly to the device main body, the inner circumferential portion and the outer circumferential portion may be, for example, eccentric to each other.

Further, when an object to be controlled by the semiconductor device of the present embodiment is, for example, a single-phase motor, three control circuits may not always be on the substrate according to the controlled object.

Here, design modifications to the above specific configuration are not limited to the above-described matters.

DESCRIPTION OF REFERENCE NUMERALS 100, 300 semiconductor device
10, 41 device main body
11 screw
12, 42 substrate
13 circuit unit
14 first phase control circuit
15 second phase control circuit
16 third phase control circuit
17 relay circuit
18 sealing resin
19 circuit board
20 inner circumferential portion
21 outer circumferential portion
22 end portion
23 first end portion
24 second end portion
25 inner circumferential surface
26 outer circumferential surface
27 inner circumferential surface
28 outer circumferential surface
29 cutout portion
30 lead
31 inner lead portion
32 outer lead portion
33 wire bonding
200 motor
201 attaching surface
202 case
203 one surface
204 protruding portion
205 screw hole

The invention claimed is:

1. A semiconductor device comprising:
a substrate that is annular or partially annular, the substrate having an inner circumferential portion formed arcuate in plan view and an outer circumferential portion formed arcuate in plan view;
a circuit unit provided on the substrate, the circuit unit being configured to individually control a plurality of phases of a motor; and
a sealing resin that is annular or partially annular, the sealing resin surrounding the substrate, wherein
the substrate has a first main surface and a second main surface which oppose each other,
the motor is attachable onto, and detachable from, the first main surface of the substrate,
the circuit unit is on the first main surface of the substrate and contacts the motor in a state where the motor is attached on the first main surface of the substrate, and the circuit unit is exposed to an outside of the sealing resin in a state where the sealing resin seals the substrate.

2. The semiconductor device according to claim 1, wherein the substrate and the sealing resin are semiannular in plan view.

3. The semiconductor device according to claim 1, further comprising:
a plurality of leads connected only to the outer circumferential portion of the substrate, wherein
each lead of the plurality of leads has an inner lead portion extending in a radial direction of the sealing resin and an outer lead portion protruding from the sealing resin,
the outer lead portion has a first portion extending radially outward continuously from the inner lead portion and a second portion extending in a thickness direction of the substrate, and
the second portion of the outer lead portion extends toward the second main surface side.

4. The semiconductor device according to claim 1, wherein
the sealing resin has a cutout portion on at least one of the inner circumferential portion and the outer circumferential portion, and
the cutout portion is used for fixing, by screwing, the semiconductor device to an attaching surface to be attached with the semiconductor device.

5. A semiconductor device mounting method comprising:
preparing a plurality of semiconductor devices each including:
a substrate that is annular or partially annular, the substrate having an inner circumferential portion formed arcuate in plan view and an outer circumferential portion formed arcuate in plan view;
a circuit unit provided on the substrate, the circuit unit being configured to individually control a plurality of phases of a motor; and
a sealing resin that is annular or partially annular, the sealing resin surrounding the substrate; and
arranging the plurality of semiconductor in a circumferential direction so as to form an annular shape as a whole, wherein
the substrate has a first main surface and a second main surface which oppose each other,
the motor is attachable onto, and detachable from, the first main surface of the substrate,
the circuit unit is on the first main surface of the substrate and contacts the motor in a state where the motor is attached on the first main surface of the substrate, and
the circuit unit is exposed to an outside of the sealing resin in a state where the sealing resin seals the substrate.

* * * * *